(12) United States Patent
Yeo et al.

(10) Patent No.: US 6,345,085 B1
(45) Date of Patent: Feb. 5, 2002

(54) SHIFT REGISTER

(75) Inventors: Ju Cheon Yeo; Jin Sang Kim, both of Kyounggi-do (KR)

(73) Assignee: LG. Philips LCD Co., Ltd., Seoul (KR)

(*) Notice: Subject to any disclaimer, the term of this patent is extended or adjusted under 35 U.S.C. 154(b) by 0 days.

(21) Appl. No.: 09/705,714

(22) Filed: Nov. 6, 2000

(30) Foreign Application Priority Data

Nov. 5, 1999 (KR) ............................................. 99-48738

(51) Int. Cl.[7] .............................................. G11C 19/00
(52) U.S. Cl. ........................................... 377/54; 377/75
(58) Field of Search ......................................... 377/54, 75

(56) References Cited

U.S. PATENT DOCUMENTS 5,325,411 A * 6/1994 Orisaka ........................ 377/54

* cited by examiner

Primary Examiner—Margaret R. Wambach
(74) Attorney, Agent, or Firm—Long Aldrige & Norman, LLP (57) ABSTRACT

A shift register for driving a pixel array is adapted to prevent a defect due to a short of a capacitor. In each stage of the shift register, an output circuit is provided with a pull-up transistor having a first input electrode for receiving a first clock signal, a first output electrode connected to a row line and a first control electrode, and a pull-down transistor having a second input electrode connected to a low-level voltage source, a second output electrode connected to the row line and a second control electrode. An input circuit generates a first control signal to be applied to the first control electrode and a second control signal to be applied to the second control electrode in response to a second clock signal having a phase different from the first clock signal. A first capacitor is connected between the input circuit and the row line, a second capacitor is connected between the second control electrode and the low-level voltage source, and a third capacitor is connected between the first control electrode and the low-level voltage source. At least one of the first to third capacitors has associated therewith a second capacitor connected in series thereto.

14 Claims, 7 Drawing Sheets

SHIFT REGISTER

This application claims the benefit of Korean Patent Application No. 1999-48738, filed on Nov. 5, 1999, which is hereby incorporated by reference for all purposes as if fully set forth herein.

BACKGROUND OF THE INVENTION

1. Field of the Invention

The present invention relates to a driving circuit for an active matrix display, and more particularly to a shift register for driving a pixel array that is adapted to prevent a short of a capacitor.

2. Discussion of the Related Art

Generally, a liquid crystal display (LCD) with an active matrix driving system uses thin film transistors (TFTs) as a switching device to display a natural moving picture. Such an LCD has been widely used for a monitor for a personal computer or a notebook computer as well as office automation equipment such as copying machines, etc., and portable equipment such as cellular phones and pagers, etc.

The active matrix LCD includes a gate driving circuit for sequentially applying a scanning pulse to row lines connected to gate electrodes of TFTs to sequentially scan a pixel train for each row line. This gate driving circuit consists of a plurality of shift registers connected in cascade to sequentially generate a scanning pulse in response to a start pulse.

Figure 1:
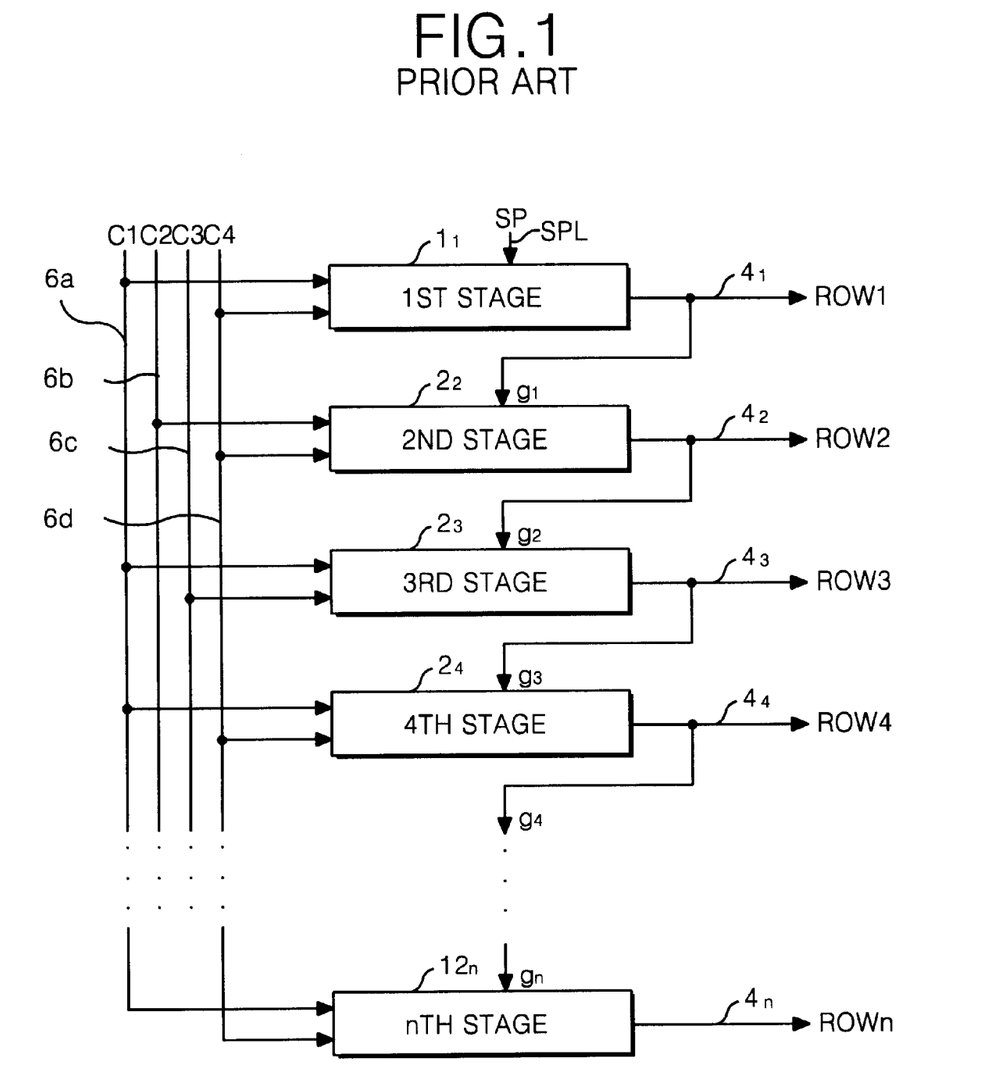
FIG. 1 is a schematic block diagram showing a configuration of a conventional shift register.
Figure 2:
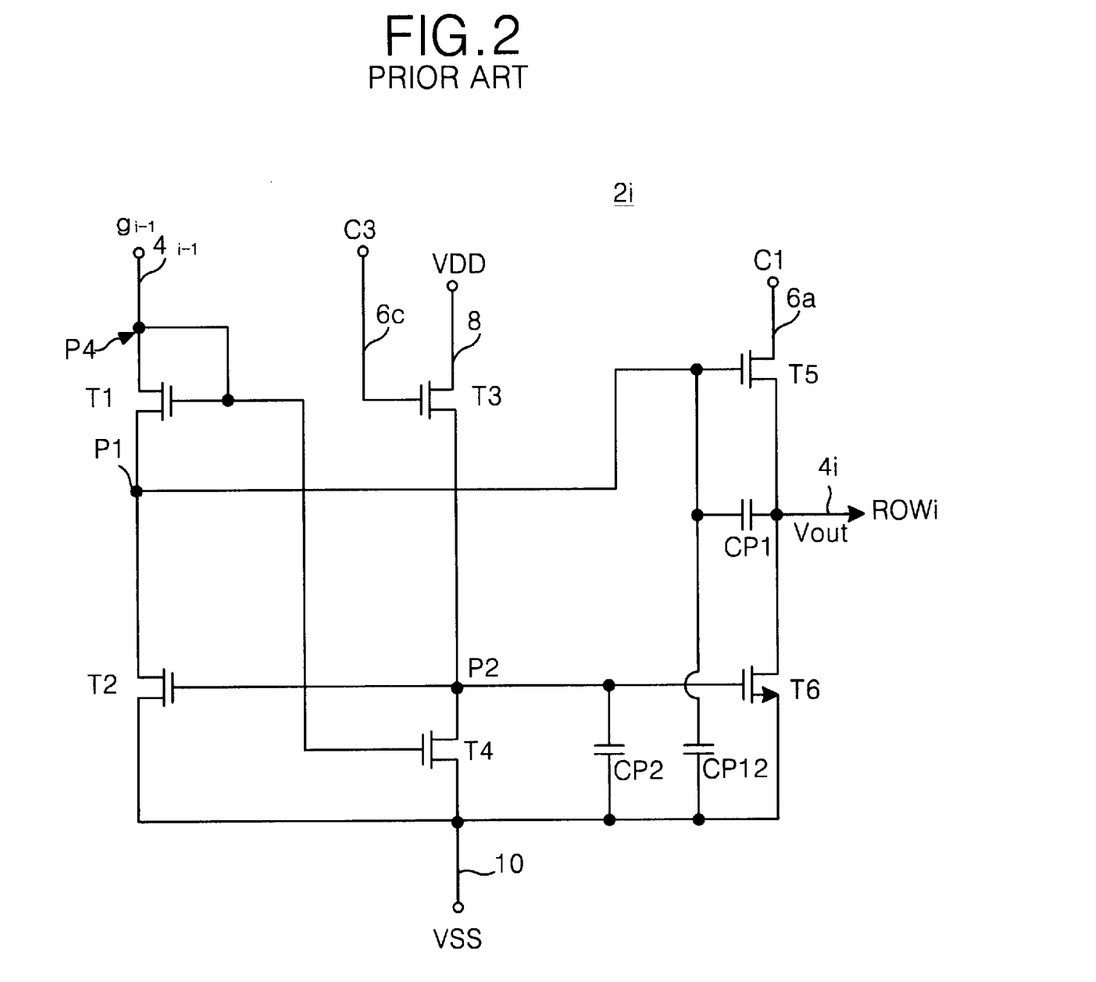
FIG. 2 is a detailed circuit diagram of each stage shown in FIG. 1.

Referring to FIG. 1, the conventional shift register includes n stages $2_1$ to $2_n$ connected to a start pulse input line. Output lines $4_1$ to $4_n$ of the n stages $2_1$ to $2_n$ are connected to n row lines ROW1 to ROWn included in a pixel array, respectively. A scanning pulse SP is applied to the first stage $2_1$, and output signals $g_1$ to $g_{n-1}$ of the first to (n-1)th stages are applied to the respective subsequent stages as scanning pulses. The input signals of the shift register, that is, the scanning pulse, first to fourth clock signals C1 to C4 having a phase delayed sequentially, the supply voltage VDD and the ground voltage VSS, are applied from external sources. As shown in FIG. 2, each of the stages $2_1$ to $2_n$ includes: a first NMOS transistor T1 connected between a first node P1 and a fourth node P4; a second NMOS transistor T2 connected between the first node P1, a second node P2 and a ground voltage line 10; a third NMOS transistor T3 connected between a supply voltage line 8, a third clock signal line 6c and the second node P2; a fourth NMOS transistor T4 connected between the second node P2, the fourth node P4, and the ground voltage line 10; a first capacitor CP1 connected between the first node P1 and an output line 4i; a fifth NMOS transistor T5 connected between the first clock signal line 6a and the output line 4i; and a sixth NMOS transistor T6 connected between the second node P2, the output line 4i and the ground voltage line 10.

When the (i-1)th row line input signal $g_{i-1}$ having a high level is applied from the previous stage $2_{i-1}$, the first and fourth NMOS transistors T1 and T4 are turned on. Then, a voltage at the first node P1 goes to a high level by the supply voltage VDD applied upon turning-on of the first NMOS transistor T1, whereas a voltage at the second node P2 is discharged to the ground voltage line 10 upon turning-on of the fourth NMOS transistor T4, so as to have a low level. As can be seen from FIG. 3, the third clock signal C3 remains at a low level voltage in a time interval when the (i-1)th row line input signal $g_{i-1}$ has a high level voltage. In other words, a high-level voltage region of the third clock signal C3 does not overlap with that of (i-1)th row line input signal $g_{i-1}$.

Figure 3:
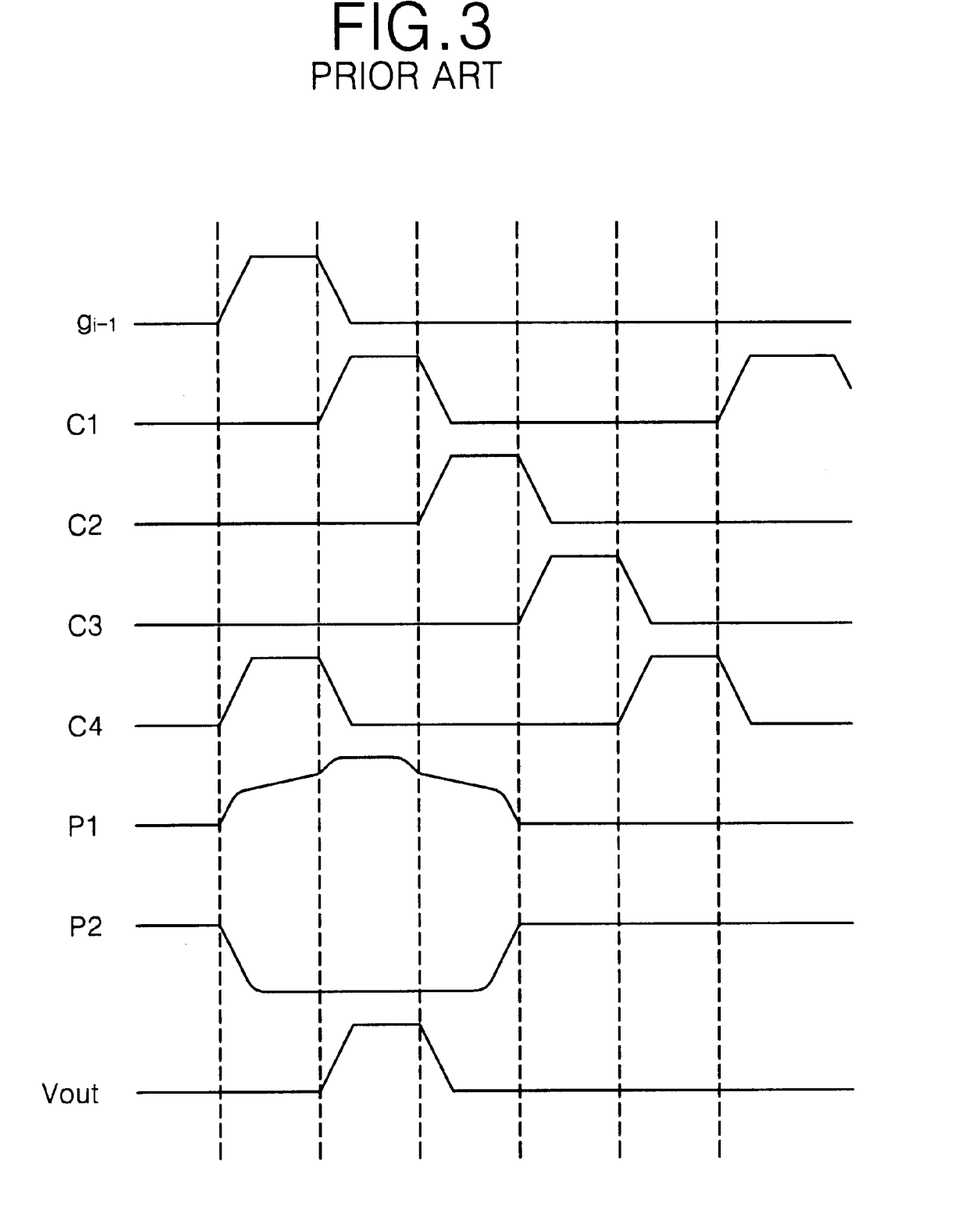
FIG. 3 is waveform diagrams of input and output signals of the stage shown in FIG. 2.

Thus, the third and fourth NMOS transistors T3 and T4 are not turned on at the same time, so that a voltage at the second node P2 is determined independently of a channel width ratio (or resistance ratio) of the third NMOS transistor T3 to the fourth NMOS transistor T4. Accordingly, even though element characteristics of the third and fourth NMOS transistors T3 and T4 are non-uniform, a circuit characteristic of the shift register is not changed to such a large extent that a normal operation is impossible. Also, since the third and fourth NMOS transistors T3 and T4 are not turned on at the same time, an overcurrent does not flow in the third and fourth NMOS transistors T3 and T4. As a result, not only are the element characteristics of the third and fourth NMOS transistors T3 and T4 not deteriorated, but also the power consumption is reduced.

If a high level voltage emerges at the first node P1, then the fifth NMOS transistor T5 is turned on. In this state, the output line 4i begins to discharge the first clock signal C1 passing through the source and drain of the fifth NMOS transistor T5 when the first clock signal C1 has a high level voltage. Thus, a high level voltage emerges at the output line 4i. When a high level voltage of first clock signal C1 is applied to the output line 4i, the capacitor CP1 raises a voltage at the first node P1 by the voltage level of the first clock signal C1. As the gate voltage is increased by the capacitor CP1, the fifth NMOS transistor T5 delivers the high-level first clock signal C1 into the output line 4i rapidly without any attenuation. Accordingly, a voltage loss caused by a threshold voltage of the fifth NMOS transistor T5 is minimized.

Subsequently, if the first clock signal C1 is changed from a high level voltage to a low level voltage, then an output voltage Vout at the output line 4i also is changed from a high level voltage to a low level voltage. This results from the fifth NMOS transistor T5 being in a turned-on state due to a voltage at the first node P1.

Next, if the third clock signal C3 is changed from a low level voltage to a high level voltage, then the third NMOS transistor T3 is turned on and hence a voltage at the second node P2 has a high level. The second NMOS transistor T2 also is turned on by virtue of a high level voltage at the second node P2 applied to its gate to discharge a voltage at the first node P1 into a ground voltage source VSS connected to the ground voltage line 10. Likewise, the sixth NMOS transistor T6 also discharges a voltage at the output line 4i, via the ground voltage line 10, into the ground voltage source VSS by virtue of a high level voltage at the second node P2 applied to its gate. As a result, a voltage at the first node P1 and then output voltage at the output line 4i have a low level.

Meanwhile, when the first clock signal C1 input to the drain of the fifth NMOS transistor T5 changes from a low level voltage to a high level voltage in such a state that a voltage at the first node P1 remains at a high level, the voltage at the first node P1 rises. In this case, a voltage rise width )Vp at the first node P1 can be set accurately by the first capacitor CP1 connected between the first node P1 and the output node 4i and a capacitor CP 12 provided between the first node P1 and the ground voltage line 10. The voltage rise width )Vp at the first node P1 is given by the following equation:

$$\Delta Vp = \frac{CP1 + C_{OX}}{CP12 + CP1 + C_{OX}} \Delta Vout \qquad (1)$$

wherein $C_{ox}$ represents a parasitic capacitance of the fifth NMOS transistor T5. Capacitance values of the capacitors CP1 and CP12 can be set to about 0.1 to 10 pF.

The capacitor CP2 connected between the second node P2 and the ground voltage line 10 restrains a voltage variation at the second node P2 when the output voltage Vout at the output node 4$i$ changes and, at the same time, restrains a voltage variation at the second node P2 caused by a leakage current from the NMOS transistors.

Since the capacitors CP1, CP2 and CP12 are used for the purpose of reducing a voltage drop caused by an element leakage current and a voltage variation at the first and second nodes P1 and P2 caused by a coupling effect, the shift resister does not malfunction even when the capacitors CP1, C2 and CP12 do not exist. Also, even though capacitance values of the capacitors CP1, CP2 and CP12 is changed to some degree, the shift register can operate almost normally. However, if any one of the capacitors CP1, CP2 and CP12 has a short circuit, then the shift register malfunctions and hence fails to generate a normal scanning pulse. For instance, the capacitors CP1, CP2 and CP12 have a short circuit when silicon particles or pin holes are mingled in the process of forming an insulating film using the vapor deposition technique. Since the capacitors CP1, CP2 and CP12 are designed to have a relatively large size, for example, since they have a size of about 100 $\mu$m×100 $\mu$m when capacitance values of the capacitors CP1, CP2 and CP12 are about 1 pF, the probability of particles or pin holes mingling into the insulating film becomes high.

If the capacitor CP1 connected between the first node P1 and the output line 4$i$ has a short, then the first NMOS transistor T1 fails to charge the output voltage sufficiently because the first node P1 is connected in series to the output line 4$i$, increasing the load. Further, if the capacitor CP1 has a short, then a scanning pulse applied to the next stage fails to have a normal voltage level because a bootstrap of the first node P1 is not made, reducing the magnitude of an output pulse applied to the output line 4$i$. When the second capacitor CP2 connected between the second node P2 and the ground voltage line 10 has a short, the second node P2 is connected, in series, to the ground voltage line 10 to set the voltage at the second node P2 to the ground voltage potential, VSS. As a result, a voltage charged into the first node P1 can not be discharged to always maintain a turned-on state of the fifth transistor T5, so that an output voltage emerging at the output line 4$i$ becomes equal to the first clock signal C1. If the capacitor CP12 connected between the first node P1 and the ground voltage line 10 has a short, then a voltage at the first node P1 is fixed to the ground voltage potential, VSS. As a result, the fifth NMOS transistor T5 always maintains an off state to keep an output voltage emerging at the output line 41 in a floating state or at a low level.

SUMMARY OF THE INVENTION

Accordingly, the present invention is directed to a shift register that substantially obviates one or more of the problems due to limitations and disadvantages of the related art.

An object of the present invention is to provide a shift register that is adapted to prevent a short of a capacitor, and/or a problem caused by such a short.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a shift register according to an embodiment of the present invention has a plurality of stages each of which comprises an output circuit including a pull-up transistor having a first input electrode for receiving a first clock signal, a first output electrode connected to a row line and a first control electrode, and a pull-down transistor having a second input electrode connected to a low-level voltage source, a second output electrode connected to the row line and a second control electrode; an input circuit for generating a first control signal to be applied to the first control electrode and for generating a second control signal to be applied to the second control electrode in response to a second clock signal having a phase different from the first clock signal; and a first capacitor connected between the input circuit and the row line, a second capacitor connected between the second control electrode and the low-level voltage source and a third capacitor connected between the first control electrode and the low-level voltage source, at least one of the first to third capacitors having at least two capacitors connected in series.

A shift register according to another embodiment of the present invention has a plurality of stages each of which comprises an output circuit including a pull-up transistor having a first input electrode for receiving a first clock signal, a first output electrode connected to a row line and a first control electrode, and a pull-down transistor having a second input electrode connected to a low-level voltage source, a second output electrode connected to the row line and a second control electrode; an input circuit for generating a first control signal to be applied to the first control electrode and for generating a second control signal to be applied to the second control electrode in response to a second clock signal having a phase different from the first clock signal; and a first capacitor connected between the input circuit and the row line, a second capacitor connected between the second control electrode and the low-level voltage source, a third capacitor connected between the first control electrode and the low-level voltage source, and a fourth capacitor connected between the first capacitor and the input circuit, at least one of the first to fourth capacitors having at least two capacitors connected in series.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiment of the present invention, examples of which are illustrated in the accompanying drawings.

Figure 4:
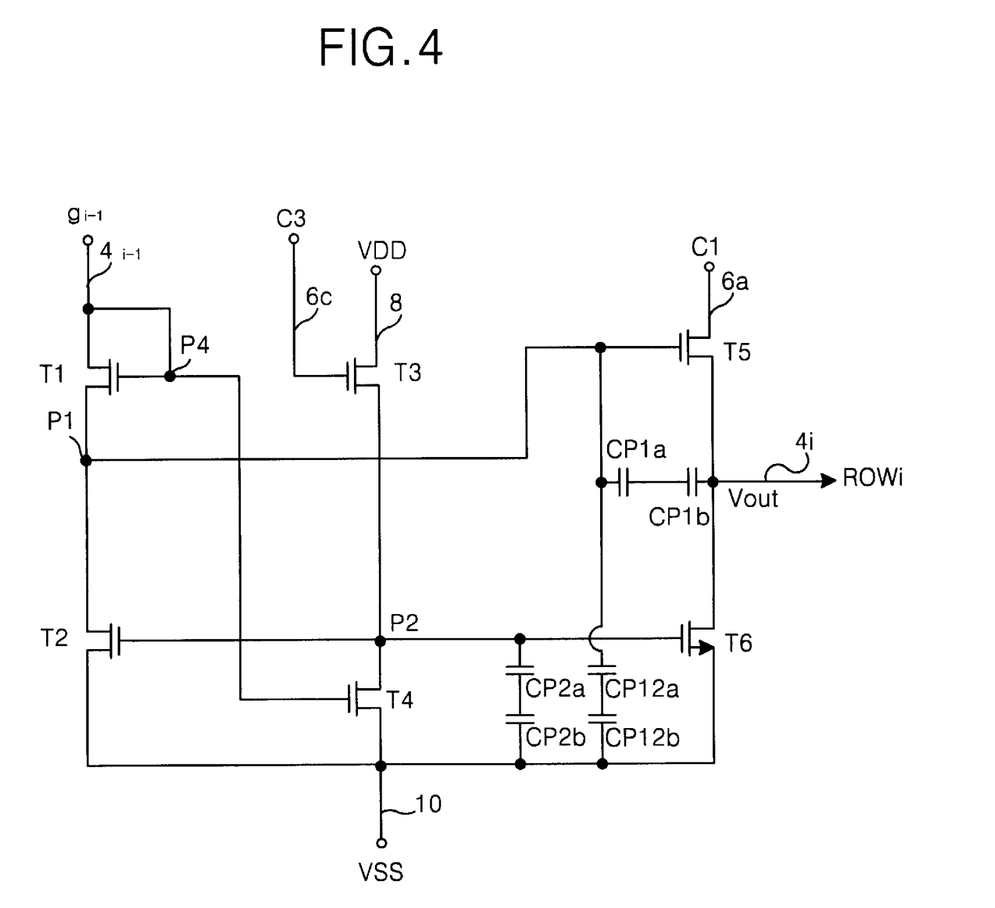
FIG. 4 is a circuit diagram of each stage of a shift register according to a first embodiment of the present invention.

Referring to FIG. 4, there is shown each stage of a shift register according to a first embodiment of the present invention. Each stage of the present shift register includes: capacitors CP1a and CP1b connected, in series, between a first node P1 and an output line 4i; capacitors CP2a and CP2b connected, in series, between a second node P2 and a ground voltage line 10; and capacitors CP12a and CP12b connected, in series, between the first node P1 and the ground voltage line 10. Even though any one of the capacitors CP1a, CP1b, CP2a, CP2b, CP12a and CPb connected in series has a short, the shift register should make a normal operation. In other words, any one of the serially connected capacitors plays a role to provide a redundancy. More specifically, even when any one of the capacitors CP1a and CP1b connected, in series, between the first node P1 and the output line 4i has a short, the other capacitor raises a voltage at the first node P1 by a voltage level of the first clock signal C1 when a high level voltage of first clock signal C1 is applied to the output line 4i. As the gate voltage increases by virtue of the capacitor CP1, the fifth NMOS transistor T5 delivers the first clock signal C1 rapidly with no attenuation. Even when any one of the capacitors CP2a and CP2b connected, in series, between the second node P2 and the ground voltage line 10 has a short, the other capacitor restrains a voltage variation at the second node P2 when an output voltage Vout at the output node 4i is changed and, at the same time, restrains a voltage variation at the second node P2 caused by a leakage current from the NMOS transistors. The capacitors CP12a and CP12b connected, in series, between the first node P1 and the ground voltage line 10 sets a voltage rise width )Vp at the first node P1, and the other capacitor charges and discharges a voltage at the second node P2 to control the voltage rise width )Vp at the second node P2 accurately even when any one of the two capacitors has a short.

When compared with each stage of the shift register shown in FIG. 2, each stage shown in FIG. 4 requires twice the number of capacitors and a capacitance value of each capacitor becomes twice. Also, an area occupied by the capacitors CPa, CPb, CP2a, CP2b, CP12a and CP12b becomes four times that of the capacitors shown in FIG. 2.

Each stage of the present shift register includes: a first NMOS transistor T1 connected between a row line $4_{i-1}$ of the previous stage $2_{i-1}$, a first node P1, and a fourth node P4; a second NMOS transistor T2 connected between the first node P1, a second node P2 and a ground voltage line 10; a third NMOS transistor T3 connected between a supply voltage line 8, a third clock signal line 6c and the second node P2; a fourth NMOS transistor T4 connected between the second node P2, the fourth node P4 and the ground voltage line 10; a fifth NMOS transistor T5 connected between the first node P1, the first clock signal line 6a, and the output line 4i, and a sixth NMOS transistor T6 connected between the second node P2, the output line 4i and the ground voltage line 10. Since an operation of such a stage is substantially identical to that of the stage shown in FIG. 2, a detailed explanation of it will be omitted.

Figure 5:
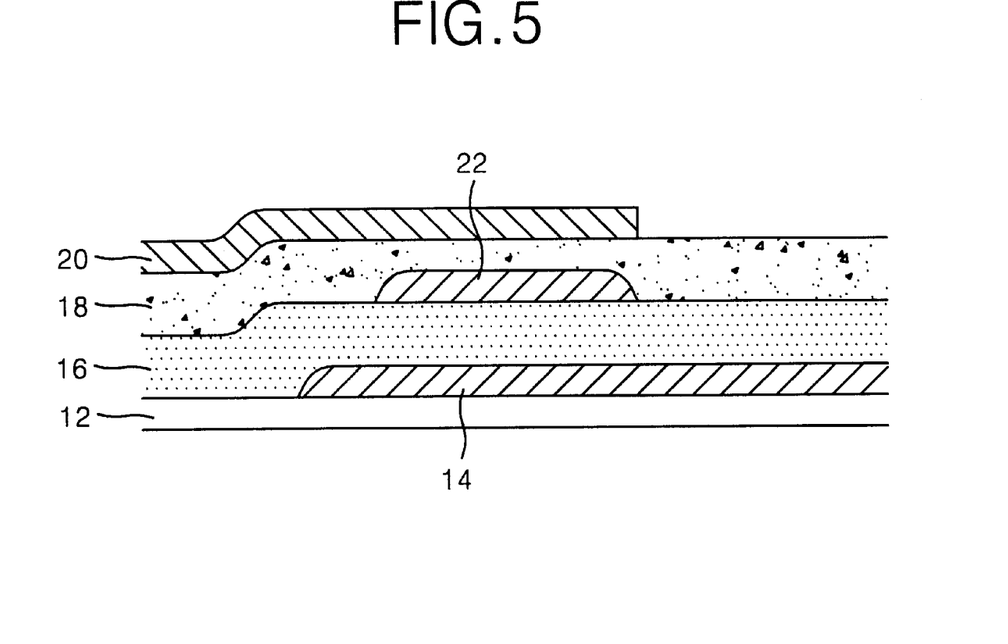
FIG. 5 is a section view showing an example of a serial connection structure of the capacitor in FIG. 4.
Figure 6:
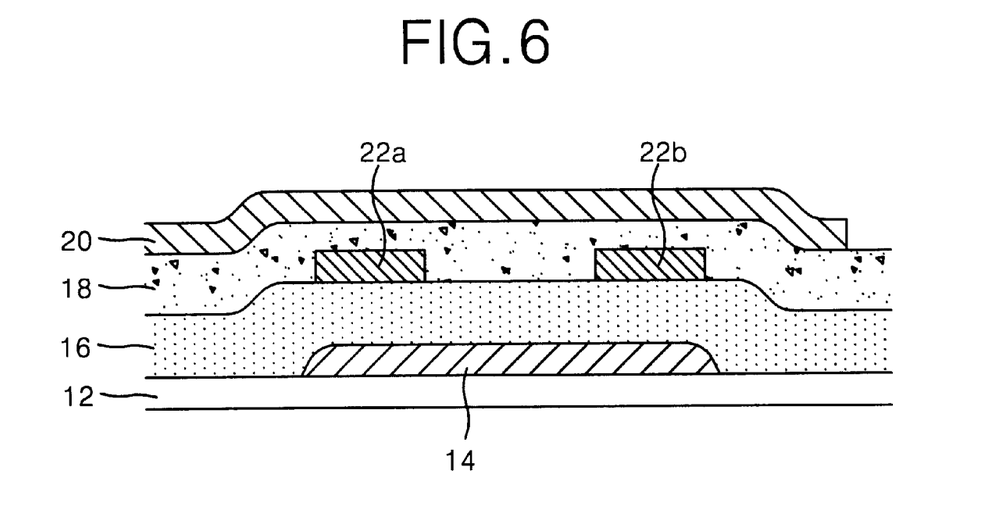
FIG. 6 is a section view showing another example of a serial connection structure of the capacitor in FIG. 4.

The serially connected capacitors can be formed to have a structure as shown in FIG. 5 or FIG. 6 by a process of fabricating TFTs. Referring now to FIG. 5, a gate metal layer 14, a first gate insulating film 16, a source/drain metal layer 22, a second insulating film 18 and a transparent electrode layer 20 are disposed sequentially on a substrate 12. One capacitor is provided between the transparent electrode layer 20 and the source/drain metal layer 22, and another capacitor is provided between the gate metal layer 14 and the source/drain metal layer 22. In this case, even when particles are mingled into any one of the first and second insulating films 16 and 18, a capacitor can be provided. In addition, a capacitor may be provided between the transparent layer 20 and the gate metal layer 14.

Referring now to FIG. 6, the serially connected capacitors are formed by a gate metal layer 14, a gate insulating film 16, first and source/drain metal layers 22a and 22b, a second insulating film 18 and a transparent electrode layer 20 disposed sequentially on a substrate 12. One capacitor is provided between the gate metal layer 14 and the first source/drain metal layer 22a, and another capacitor is provided between the gate metal layer 14 and the second source/drain metal layer 22b.

Figure 7:
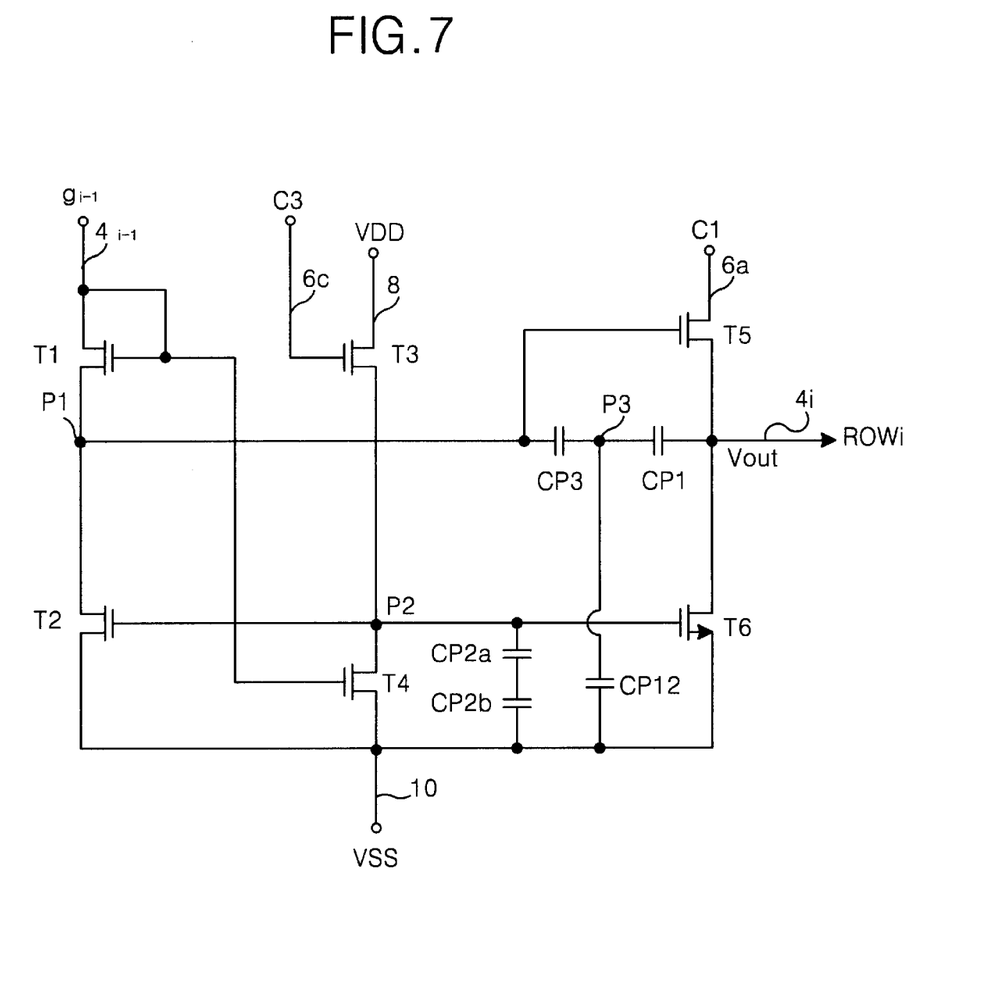
FIG. 7 is a circuit diagram of each stage of a shift register according to a second embodiment of the present invention.

Referring to FIG. 7, there is shown each stage of a shift register according to a second embodiment of the present invention. Each stage of the present shift register includes: capacitors CP1 and CP3 connected in series between a first node P1 and an output line 4i; capacitors CP2a and CP2b connected in series between a second node P2 and a ground voltage line 10; and a capacitor CP12 connected in series between a third node P3 and the ground voltage line 10. The capacitor CP3 connected between the first node P1 and the third node P3 plays a role to provide a redundancy for the capacitors CP1 and CP12 connected, via the third node P3, to itself in parallel. In other words, even when any one of the capacitors CP1, CP3 and CP12 has a short, the shift register does not make a malfunction. In the case where the capacitor CP3 connected between the first node P1 and the third node P3 has a short, this stage is configured by the same circuit as the stage in FIG. 2 except that the capacitors CP2a and CP2b are connected, in series, between the second node P2 and the ground voltage line 10. When the capacitor CP1 connected between the third node P3 and the output line 4i has a short, the stage operates in the same manner as the case where the capacitor CP12 connected between the third node P3 and the ground voltage line 10 dose not exist. Further, when the capacitor CP12 connected between the third node P3 and the ground voltage line 10 has a short, the stage operates in the same manner as the case where the capacitor CP1 connected between the first node P1 and the output line 4i does not exist in the stage shown in FIG. 2. The capacitors CP2a and CP2b connected, in series, between the second node P2 and the ground voltage line 10 and the capacitors CP3 and CP1 connected between the first node P1 and the output line 4i are formed to have the structure as shown in FIG. 5 or FIG. 6.

Meanwhile, if the capacitor CP1 connected between the third node P3 and the output line 4i has a short, then a leakage current at the first node P1 may increase to allow the stage to make somewhat unstable operation. Also, if the capacitor CP12 connected between the third node P3 and the ground voltage line 10 has a short, then an output voltage emerging at the output line 4i may be reduced by a small amount. In this case, since the purpose of providing the capacitors for the stage is to reduce an unstable operation which may be generated when characteristics of the elements are non-uniform, the stage makes a stable operation in spite of a short of the capacitors CP1 and CP12 when the TFTs have a stable characteristic.

When compared with the shift register stage shown in FIG. 2, the shift register stage shown in FIG. 7 requires one and half times the total capacitance value of capacitors, and an area occupied by the capacitors becomes 2.2 times the area of the capacitors of FIG. 2. When compared with the stage shown in FIG. 4, the stage shown in FIG. 7 has one fewer capacitor. Thus, an area occupied by the capacitors and the required capacitance value are reduced compared with the embodiment shown in FIG. 7.

Figure 8:
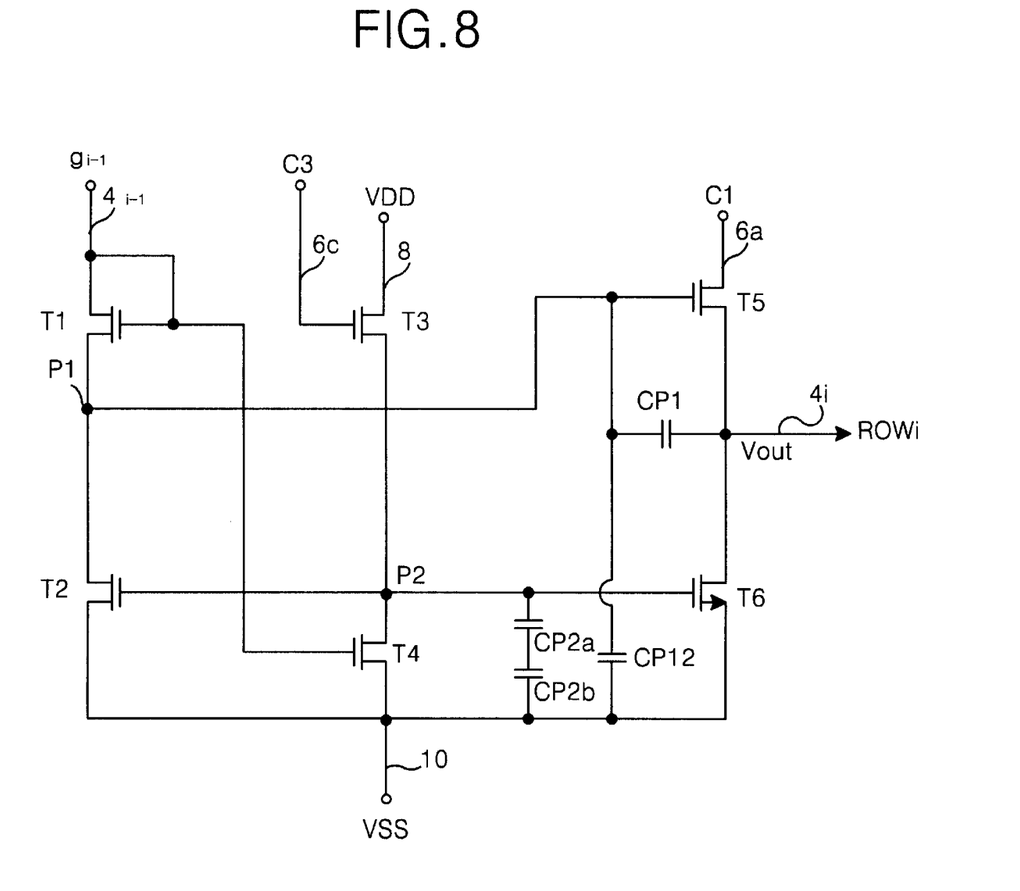
FIG. 8 is a circuit diagram of each stage of a shift register according to a third embodiment of the present invention.

Referring to FIG. 8, there is shown each stage of a shift register according to a third embodiment of the present invention. Each stage of the present shift register includes: a capacitor CP1 connected between a first node P1 and an output line 4i; capacitors CP2a and CP2b connected in series between a second node P2 and a ground voltage line 10; and a capacitor CP12 connected between the first node P1 and the ground voltage line 10. Such a stage can be used when the shift register is arranged at the left and right sides of the panel. If the shift register is arranged at the left and right sides of the panel, then it can make a normal operation by a driving of the stage positioned at an opposite side of the output line 4i even though the capacitors C1 and C12 connected, in cascade, to the output line 4i. Accordingly, when the shift register is arranged at the left and right sides of the panel, since it can make a normal operation as long as a short of the capacitor positioned between the second node P2 and the ground voltage line 10 is prevented, only the two capacitors CP2a and CP2b positioned between the second node P2 and the ground voltage line 10 should be connected.

As described above, at least two capacitors are connected in series between the output node and the bootstrap node and between the direct current source and the bootstrap node, so that a short of the capacitors can be prevented.

It will be apparent to those skilled in the art that various modifications and variation can be made in a shift register of the present invention without departing from the spirit or scope of the invention. Thus, it is intended that the present invention cover the modifications and variations of this invention provided they come within the scope of the appended claims and their equivalents.

What is claimed is:

1. A shift register including a plurality of stages which are commonly connected to a high-level voltage source, a low-level voltage source and a phase-delayed clock signal generator and individually connected to row lines and are connected, in cascade, with respect to a scanning signal so as to charge and discharge each of the row lines, each stage of the shift register comprising:

an output circuit including a pull-up transistor having a first input electrode for receiving a first clock signal, a first output electrode connected to the row line and a first control electrode, and a pull-down transistor having a second input electrode connected to the low-level voltage source, a second output electrode connected to the row line and a second control electrode;

an input circuit for generating a first control signal to be applied to the first control electrode and for generating a second control signal to be applied to the second control electrode in response to a second clock signal having a phase different from the first clock signal; and a first capacitor means connected between the input circuit and the row line, a second capacitor means connected between the second control electrode and the low-level voltage source, and a third capacitor means connected between the first control electrode and the low-level voltage source, at least one of the first to third capacitor means including at least two capacitors connected in series.

2. The shift register according to claim 1, wherein each of the first to third capacitor means includes at least two capacitors connected in series.

3. The shift register according to claim 1, wherein each of the first and third capacitor means includes only one capacitor, and wherein the second capacitor means includes at least two capacitors connected in series.

4. The shift register according to claim 1, wherein each of the serially connected capacitors further comprises:

at least two electrode layers and an insulating layer disposed alternately on a substrate.

5. The shift register according to claim 1, wherein each of the serially connected capacitors further includes:

a first electrode layer provided on a substrate;
an insulating layer covering the first electrode layer; and
at least two second electrode layers provided on the insulating layer, said two second electrode layers being disposed in a same plane so as to be opposed to the first electrode layer.

6. A shift register including a plurality of stages which are commonly connected to a high-level voltage source, a low-level voltage source and a phase-delayed clock signal generator and individually connected to row lines and are connected, in cascade, with respect to a scanning signal so as to charge and discharge each of the row lines, each stage of the shift register comprising:

an output circuit including a pull-up transistor having a first input electrode for receiving a first clock signal, a first output electrode connected to the row line and a first control electrode, and a pull-down transistor having a second input electrode connected to the low-level voltage source, a second output electrode connected to the row line and a second control electrode;

an input circuit for generating a first control signal to be applied to the first control electrode and for generating a second control signal to be applied to the second control electrode in response to a second clock signal having a phase different from the first clock signal; and a first capacitor means connected between an intermediate terminal and the row line, a second capacitor means connected between the second control electrode and the low-level voltage source, a third capacitor means connected between the intermediate terminal and the low-level voltage source, and a fourth capacitor means connected between the first capacitor and the input circuit, at least one of the first to fourth capacitor means including at least two capacitors connected in series.

7. The shift register according to claim 6, wherein each of the first, third and fourth capacitor means includes one capacitor, and wherein the second capacitor means includes at least two capacitors connected in series.

8. A shift register comprising a plurality of stages, each of said stages being commonly connected to a high-level voltage source, a low-level voltage source and a phase-delayed clock signal generator, and being individually connected to a corresponding one of a plurality of row lines, and said stages being connected, in cascade, with respect to a scanning signal so as to charge and discharge each of the row lines, each of said stages comprising:

an output circuit having a first input electrode for receiving a first clock signal, a second input electrode connected to the low-level voltage source, an output connected to the corresponding row line, and first and second control electrodes;

an input circuit for generating a first control signal to be applied to the first control electrode and for generating a second control signal to be applied to the second control electrode in response to a second clock signal having a phase different from the first clock signal; and a first capacitor connected between the first control electrode and the corresponding row line, a second capacitor connected between the second control electrode and the low-level voltage source, a third capacitor connected between the first control electrode and the low-level voltage source, and a fourth capacitor connected in series to one of the first, second and third capacitors.

9. The shift register of claim 8, wherein the output circuit comprises:

a pull-up transistor having connected to the first input electrode and the first control electrode, and having a first output electrode connected to the row line; and a pull-down transistor connected to the second input electrode and second control electrode and having a second output electrode connected to the row line.

10. The shift register of claim 8, further comprising a fifth capacitor connected in series to a second one of the first, second and third capacitors.

11. The shift register of claim 10, further comprising a sixth capacitor connected in series to a third one of the first, second and third capacitors.

12. The shift register of claim 8, wherein the capacitors connected in series further comprise:

a first electrode layer formed on a substrate;

a first insulating layer formed immediately on the first electrode layer;

a second electrode layer formed immediately on the first insulating layer;

a second insulating layer formed immediately on the second electrode layer; and a third electrode layer formed immediately on the second insulating layer.

13. The shift register of claim 12, wherein the third electrode layer is a transparent electrode layer.

14. The shift register of claim 8, wherein the capacitors connected in series further comprise:

a first electrode layer provided on a substrate;

an insulating layer covering the first electrode layer; and at least two second electrode layers provided on the insulating layer, said two second electrode layers being disposed in a same plane so as to be opposed to the first electrode layer.

* * * * *